United States Patent [19]
Freeman et al.

[11] Patent Number: 5,214,275
[45] Date of Patent: May 25, 1993

[54] OPTICALLY CONTROLLED MICROWAVE SWITCH AND SIGNAL SWITCHING SYSTEM

[75] Inventors: James L. Freeman, Renton; Sankar Ray, Bellevue, both of Wash.

[73] Assignee: The Boeing Company, Seattle, Wash.

[21] Appl. No.: 768,836

[22] Filed: Sep. 30, 1991

[51] Int. Cl.[5] .............................................. H01J 40/14
[52] U.S. Cl. .................................. 250/208.4; 250/551; 250/214 R
[58] Field of Search ......... 250/208.4, 214 R, 214 SW, 250/208.5, 208.6, 211 J; 357/22, 30 E, 30 G, 30 I; 307/311

[56] References Cited

U.S. PATENT DOCUMENTS

| | | | |
|---|---|---|---|
| 4,227,098 | 10/1980 | Brown et al. | 307/311 |
| 4,303,831 | 12/1981 | El Hamamsy | 250/551 |
| 4,419,586 | 12/1983 | Phipps | 250/551 |
| 4,636,646 | 1/1987 | Hartman et al. | 250/551 |
| 4,782,223 | 11/1988 | Suzuki | 250/214 R |
| 5,073,718 | 12/1991 | Paolella | 250/551 |

OTHER PUBLICATIONS

S. J. Wojtczuk et al., "Comparative Study of Easily Integrable Photodetectors," *Journal of Lightwave Technology* LT-5:1365-1370 (1987).

Sugeta et al., Metal-Semiconductor-Metal Photodetector for High-Speed Optoelectronic Circuits, Proceedings of the 11th Conference (1979 International) on Solid State Devices, Tokyo, 1979; *Japanese Journal of Applied Physics*, vol. 19, Supp. 19-1, pp. 459-464 (1980).

Frequency and Pulse Response of a Novel High Speed Interdigital Surface Photoconductor (IDPC), *IEEE Electron Device Letters*, vol. Edl-2, No. 5, pp. 112-114 (May 1981).

*Primary Examiner*—David C. Nelms
*Assistant Examiner*—K. Shami
*Attorney, Agent, or Firm*—Christensen, O'Connor, Johnson & Kindness

[57] ABSTRACT

Disclosed is an optically activated microwave switch (10) which includes a field-effect transistor (12) that is switched between conducting and nonconducting states by a photodiode (14) that is connected between the field-effect transistor gate and drain electrode and a photodiode (16) that is connected between the field-effect transistor gate and source electrode. The circuit is configured and arranged for switching unbiased sinusoidal microwave signals of a frequency as high as approximately 10 gigahertz. A cascade arrangement of switches (10) provides increased signal handling capability in situations in which a single switch cannot be employed. Monolithic integrated circuit realizations of both single stage and cascaded stage arrangements are disclosed in which the semiconductor substrate is GaAs, the field-effect transistors are metal-semiconductor field-effect transistors and the photodiodes are interdigitated metal-semiconductor-metal devices.

34 Claims, 3 Drawing Sheets

OPTICALLY CONTROLLED MICROWAVE SWITCH AND SIGNAL SWITCHING SYSTEM

FIELD OF THE INVENTION

This invention relates to optically actuated microwave switches and, more particularly, to optoelectronic switches that are physically and electrically compatible with various types of microwave transmission line and antenna structure.

BACKGROUND OF THE INVENTION

Microwave switches that are activated by an electrical control signal are often undesirable. For example, when such a switch is used in conjunction with certain types of transmission line or various types of antenna structure, the wire or other type of conductor that supplies the switch control signal sometimes must be positioned within a region of the transmission line or antenna that supports propagation of the microwave signal. In these situation, the control conductor can interfere with the desired propagation, radiation or reception of the switched microwave signal. Further, signals that are induced in such conductors by extraneous electromagnetic fields can result in undesirable system noise or interference.

Various optically actuated or controlled switches have been proposed to eliminate the need for conductors or wires that carry control signals to the switch. For example, attempts have been made to use various types of depletion-layer photodiodes as microwave switches (e.g., p-i-n diodes, p-n junction diodes, Schottky barrier diodes, and heterojunction diodes). Although satisfactory in some applications, the current-voltage characteristics of a depletion-layer photodiode are not symmetric about the current and voltage axes. Thus, a bias signal must be supplied to a depletion-layer photodiode if the device is to be used as a microwave switch for sinusoidal or other time-varying signals that have both positive and negative components.

One type of optically activated microwave switch that has found some application utilizes a laser-excited conductive plasma or a solid-state photoconductive material. For example, switches have been proposed in which a gap of approximately 2-25 micrometers is formed in a microstrip transmission line. When the gap is illuminated by a high-power laser pulse, the gap is short-circuited and microwave signals propagate along the microstrip transmission line in the normal manner. When the gap is not illuminated by the laser pulse, the gap forms a high impedance discontinuity in the transmission line.

The need for high energy illumination pulses makes such microstrip gap switches unsuitable for many applications. For example, it can be necessary to simultaneously activate a large number (e.g., an array) of switches from a single source of optical energy. If the source of optical energy is a single laser diode or other such device, the amount of peak optical power that may be available for each device may be 1 milliwatt or less. Attaining such high optical sensitivity requires both sensitive devices and efficient coupling of the optical signal. In this regard, it is preferable that the optically sensitive region of a microwave switch match the pattern of light that is supplied to activate the switch. By way of example, in systems in which light is coupled from the end of an optical fiber to the switching device, the spot of light provided will be substantially circular in geometry and typically will range in diameter from approximately 10 microns (single-mode optical fiber) to approximately 50 microns (multi-mode optical fiber).

Although various proposals have been made, the prior art has not provided a highly sensitive optoelectronic microwave switch that does not require electrical bias or control signals while simultaneously meeting design constraints normally associated with microwave switching devices. Specifically, to be suitable for widespread application, a microwave switch must exhibit low insertion loss when activated (i.e., a relatively low on-state resistance such as 50 ohms or less) and must exhibit relatively high isolation when not activated (a high off-state impedance). As is known in the art, microwave switch circuits that include or consist of a semiconductor circuit present capacitive reactance that often limits the maximum frequency at which the switch can be employed. For example, in a 50 ohm system, a microwave switch must present an off-state capacitance of approximately 16 femto-farads ($16 \times 10^{-15}$ farads) to maintain an isolation of 20 decibels (1000 ohms reactance) at a frequency of 10 gigahertz.

SUMMARY OF THE INVENTION

The invention provides a solid state microwave switch that is actuated by relatively low power optical signals, operates into the gigahertz range and provides relatively high speed switching without requiring electrical signals for switch control or bias. For example, current realizations of the invention are actuated with less than 1 milliwatt of optical power and provide nanosecond optical switching speeds for microwave signal frequencies approaching 10 gigahertz.

Considered in its basic schematic form, the invention comprises at least two photodiodes and a field-effect transistor with the photodiodes being connected to supply a gate signal to the field-effect transistor. More specifically, one or more photodiodes are interconnected between the gate and source electrodes of the field-effect transistor. Similarly, one or more photodiodes are interconnected between the gate and drain electrodes of the field-effect transistor. In this arrangement, both the gate-to-drain voltage of the field-effect transistor and the gate-to-source voltage of the field-effect transistor are determined by the number of photodiodes employed and the polarity in which the photodiodes are connected. Specifically, in the practice of the invention, when the photodiodes are illuminated by light conveyed by a fiber optic line from a remote light source, the voltage that is established between the gate and source electrode of the field-effect transistor and the voltage that is established between the gate and drain electrode of the field-effect transistor cause the field-effect transistor to switch from one source to drain conduction state to another (e.g., nonconducting to conducting) and remain in the switched state regardless of the polarity of the drain to source signal (i.e., the signal developed between the drain and source of the field-effect transistor by the signal being switched). Thus, the arrangement exhibits bilateral switching characteristics, i.e., operation of the switch is independent of the polarity of the signal being switched as long as the applied microwave signal voltage is small. To optimize the bilateral characteristics of the invention, the field-effect transistor is fabricated so that the drain and source of the device in effect are interchangeable. That is, the field-effect transistor is fabricated so that the gate voltage transfer characteristics remain substantially the same when the electrode that normally would be identified as the source electrode is connected as the drain electrode.

The disclosed embodiment of the invention includes a n-channel enhancement-mode field-effect transistor having photodiodes connected between the gate and source electrodes and the gate and drain electrodes so that illumination of the photodiodes maintains the gate electrode at a positive potential that exceeds the transistor gate threshold voltage. In the currently preferred embodiments of the invention, the field-effect transistor is a gallium arsenide (GaAs) metal-semiconductor field-effect transistor (MESFET), and the photodiodes are metal-semiconductor (i.e., Schottky barrier) diodes. To provide Schottky barrier photodiodes that exhibit a photosensitive region sized to correspond with conventional optical fibers, the preferred embodiments of the invention utilize a metal-semiconductor-metal (MSM) structure in which the anode and cathode of the diode (and, hence, the photosensitive device depletion region) is defined by a series of interdigitated spaced-apart, finger-like conductive regions.

The currently preferred embodiments of the invention are realized in integrated circuit form with the field-effect transistor and the photodiodes being formed in the same substrate. In these embodiments, the MESFET is defined by identical, substantially rectangular drain and source metallization regions with the gate being defined by a narrow metallization region that extends between the spaced-apart drain and source metallizations. To define the Schottky barrier photodiodes, the gate metallization is formed of Schottky metal and extends beyond the boundary of the field-effect transistor source and drain metallization to form the anode structure of both of the photodiodes. In particular, each edge of the gate metallization that extends beyond the boundary of the field-effect transistor includes a set of spaced-apart, orthogonally extending finger-like strips of metallization. In this arrangement, the length and number of finger-like Schottky metal strips is selected to define a substantially rectangular pattern that is commensurate in size with the optical spot size of the optical fiber conveying optical energy from a remote source, or other source of optical energy used to activate the switch.

The cathode structure of each Schottky barrier photodiode is defined by a set of spaced-apart finger-like conductive strips. Each set of cathode-forming finger-like conductive strips in interdigitated with a different set of the finger-like metallization strips that forms the photodiode anode structure. Conventional metallization (ohmic metal) interconnects the two sets of cathode-forming conductive strips with the drain and source metallization of the field-effect transistor. In the currently preferred realizations of the invention, the finger-like conductive strips that define the cathodes of the photodiodes are formed by ion implantation which results in a n+ conductive region being defined within the GaAs substrate.

The signal handling capability of the above-described embodiments of the invention is limited to applications in which the peak voltage of the microwave signal being switched does not exceed twice the gate voltage that causes the field-effect transistor to begin conducting. In particular, when the photodiodes are not illuminated, the photodiodes in effect form a high impedance resistive voltage divider that establishes the potential at the gate electrode of the field-effect transistor equal to one-half the potential appearing between the source and drain electrodes. Thus, when a microwave signal is applied to the source (or drain) electrode of one of the above-described embodiments of the invention and the field-effect transistor is in the off-state (no illumination supplied to the photodiodes), the voltage at the gate electrode of the field-effect transistor will be substantially equal to one-half the voltage of the applied microwave signal. Because of this "dark current" the signal handling capability of the above-mentioned embodiments of the invention that employ GaAs enhancement-mode MESFETs and Schottky barrier photodiodes is limited to approximately 0.2 volts peak (or 0.4 volts peak-to-peak).

In accordance with the invention, increased signal handling capability can be attained by using a depletion-mode field-effect transistor and a number of photodiodes that is sufficient to switch the field-effect transistor from a conducting to a nonconducting state when the photodiodes are illuminated. Further, a series of N enhancement-mode switches of the above-described type can be cascaded to increase the peak-to-peak signal handling capability by a factor of N. In the cascaded arrangement, the switch cutoff frequency and the insertion loss (on-resistance) can be maintained substantially equal to the insertion loss and cut-off frequency of a single switch by appropriately scaling the field-effect transistor gate width-to-length ratio. In addition, the integrated circuit topology of an embodiment of the invention that includes N-cascaded stages can be established so that the 2N photodiodes required for activating the switches are realized within a substantially rectangular region that can be illuminated by a single optical fiber or other suitable source of optical energy.

DETAILED DESCRIPTION

Figure 1:
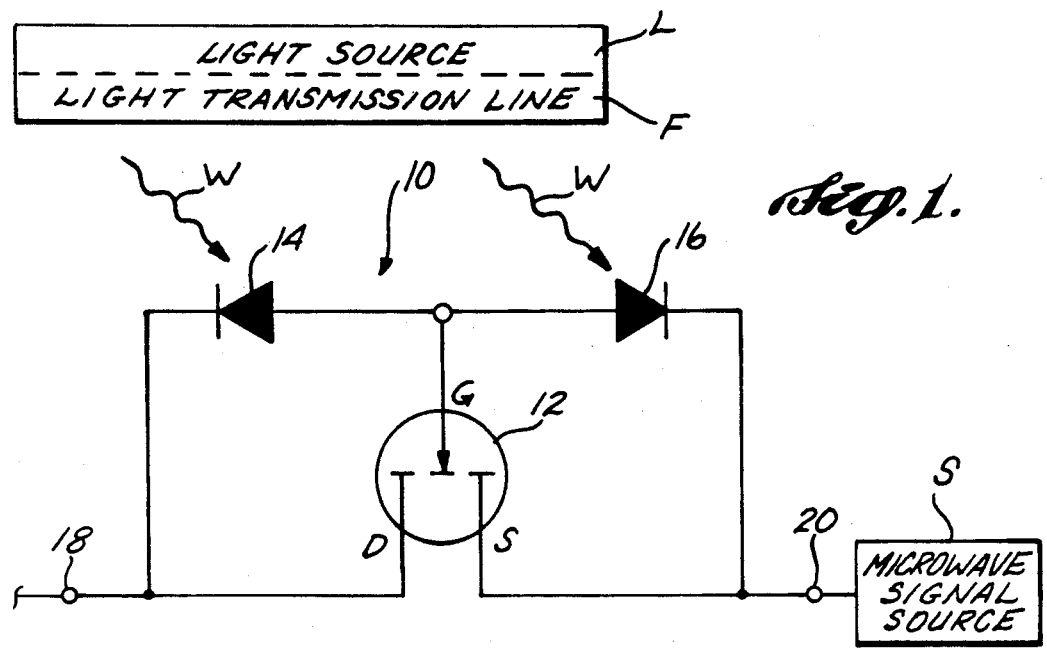
FIG. 1 schematically depicts a switching circuit constructed in accordance with the invention.
Figure 2:
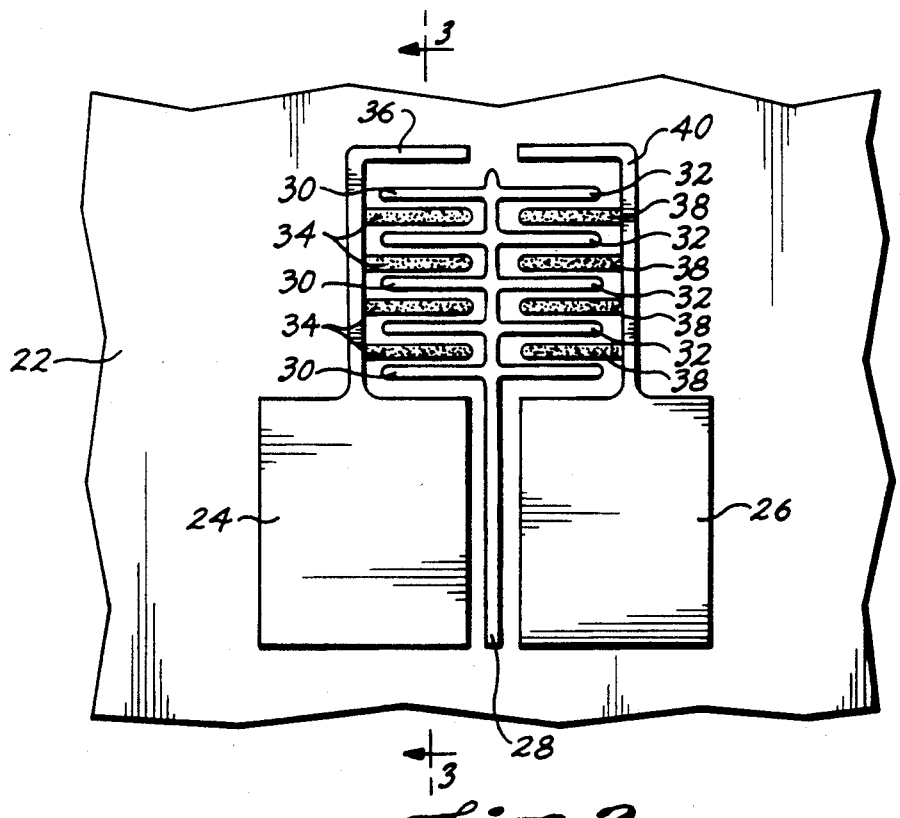
FIG. 2 is a plan view of an integrated circuit realization of the switch shown in FIG. 1.
Figure 3:
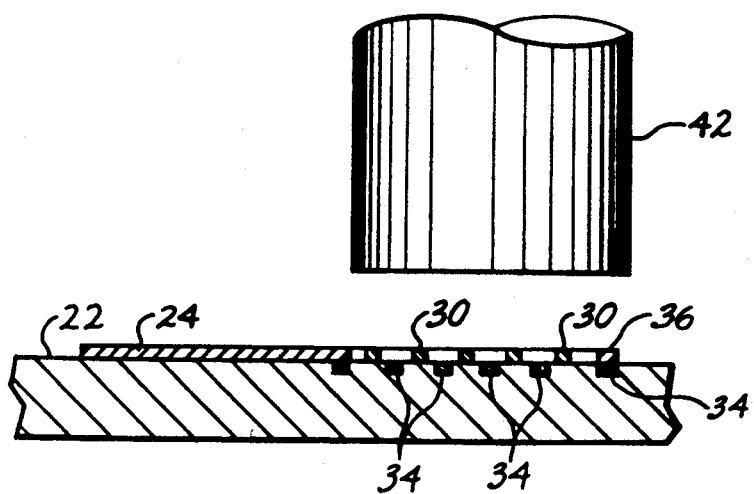
FIG. 3 is a sectional view of the integrated circuit of FIG. 2 taken along section lines 3—3 of FIG. 2.

The currently preferred embodiment of the invention is shown in schematic diagram form in FIG. 1 and is illustrated in integrated circuit form in FIGS. 2 and 3. As can be seen in FIG. 1, an optoelectronic switch configured in accordance with the invention (generally identified by numeral 10) includes a field-effect transistor 12 and two photodiodes 14 and 16. The photodiodes are in the path of light waves W from a light transmission line, such as an optical fiber F which conveys the light from a remote light source L as shown diagrammatically in FIG. 1. In the depicted arrangement, field-effect transistor 12 is an enhancement-mode field-effect transistor, preferably being a GaAs metal-semiconductor field-effect transistor ("MESFET"). Photodiodes 14 and 16 of the currently preferred embodiments are Schottky barrier diodes of the interdigitated variety. As is shown in FIG. 1, the anodes of photodiodes 14 and 16 are both connected to the gate electrode of field-effect transistor 12; the cathode of photodiode 14 is connected to the drain electrode of field-effect transistor 12; and the cathode of photodiode 16 is connected to the source electrode of field-effect transistor 12.

Switch 10 is configured to in effect operate as a single-pole, single-throw switch. In this regard, a high impedance is presented between switch terminals 18 and 20 when photodiodes 14 and 16 are not illuminated, because field-effect transistor 12 is in the nonconducting state and photodiodes 14 and 16 exhibit relatively low leakage current. On the other hand, simultaneous illumination of photodiodes 14 and 16 produces a photovoltage that causes field-effect transistor 12 to switch to the conducting state and thus provide a low impedance path between switch terminals 18 and 20.

To ensure proper switching of field-effect transistor 12, illumination of photodiodes 14 and 16 must produce a voltage at the gate electrode of field-effect transistor 12 that exceeds the gate threshold voltage for field-effect transistor 12. For example, the GaAs MESFETs used in the currently preferred embodiments of the invention exhibit a gate threshold voltage on the order of 0.1 to 0.2 volts, and, in addition, exhibit high impedance between the gate and drain electrode and high impedance between the gate and source electrodes. Because of the high impedance levels and low voltage requirement, various types of photodiodes can be used. For example, the Schottky photodiodes that are used in the currently preferred embodiments of the invention provide an open circuit voltage on the order of 0.6 to 0.8 volts.

It should be noted that use of MESFETs or other devices that present a high impedance to the photodiodes results in high optical sensitivity. For example, in the currently preferred embodiments, the high gate-drain and high gate-source impedance of field-effect transistor 12 results in a gate potential that is substantially equal to the photodiode open circuit voltage (since only a small photocurrent will flow into the field-effect transistor gate electrode). Hence, very little optical power is required to control switch 10 (i.e., switch field-effect transistor 12 to a conducting state). For example, in the currently preferred embodiments, much less than 1 milliwatt of optical power is required to drive switch 10. Since currently available laser diodes (e.g., a AlGaAs/GaAs laser diode) have an output power on the order of 0.1 to 0.5 watts, a large number of microwave switches 10 (e.g., an array) can be simultaneously switched by a single laser diode.

Those skilled in the art will recognize that a series of like-poled photodiodes can be substituted for photodiodes 14 and 16 of FIG. 1 in instances in which a single photodiode does not produce voltage (or current) that is sufficient to drive the switching device being employed (e.g., field-effect transistor 12). By way of example, in applications that require a switch that is in the conducting state when the photodiodes are not illuminated and nonducting when the photodiodes are illuminated, a depletion-mode field-effect transistor can be employed as field-effect transistor 12 in FIG. 1. When a depletion mode field-effect transistor is used, two or more photodiodes typically will be substituted for each photodiode 14 and 16.

Switch 10 is configured for bilateral switching operation. That is, to allow the switching of an unbiased sinusoidal microwave signal, such as by a conventional transmission line from a microwave signal source S shown diagrammatically in FIG. 1, switch 10 is configured and arranged to exhibit substantially equal impedances during both positive and negative portions of the input signal. In this regard, it can first be noted that the depicted connection of diodes 14 and 16 produce substantially identical field-effect transistor gate voltages, regardless of the polarity of the signal being switched. That is, when the signal being switched causes switch terminal 18 to be more positive than switch terminal 20, photodiode 14 maintains the gate electrode of field-effect transistor 12 at a potential that is above the potential at terminal 18 by an amount that exceeds the field-effect transistor gate threshold voltage. Thus, the switched signal current flows through the drain-source channel of field-effect transistor 12. Conversely, when the signal being switched causes the potential at switch terminal 20 to exceed the potential at switch terminal 18, photodiode 16 maintains the gate electrode of field-effect transistor 12 at a potential that exceeds the potential at switch terminal 20 by at least the gate threshold voltage. Accordingly, the switched signal again flows through the drain-source channel of field-effect transistor 12.

It will be noted that distortionless bilateral switching by switch 10 of FIG. 1 requires the source and drain electrodes of field-effect transistor 12 to be "interchangeable" so that field-effect transistor 12 exhibits identical drain-source conductance characteristics during negative-going and positive-going portions of an applied signal. That is, the transfer characteristic of field-effect transistor 12 (drain current as a function of gate voltage) when the gate electrode is positive relative to the source electrode should be identical to the transfer characteristic that is exhibited when the gate electrode is positive relative to the drain electrode. Substantially identical transfer characteristics are readily attainable using fabrication techniques that currently are used to realize both discrete and integrated circuit field-effect transistors.

Shown in FIGS. 2 and 3 is a monolithic integrated circuit realization of switching circuit 10 of FIG. 1. Referring first to FIG. 2, field-effect transistor 12 of FIG. 1 preferably is realized as a coplanar MESFET that is formed on a semi-insulating GaAs substrate 22. In the depicted arrangement, a substantially rectangular drain metallization 24 is positioned in spaced-apart juxtaposition with a rectangular source metallization 26 of identical area and dimensions. Extending between the drain metallization 24 and source metallization 26 is a Schottky gate metallization 28 (i.e., metallization that establishes a Schottky barrier at the metallization-substrate interface). The ion-implanted active and contact regions and the metallized probe or pad locations for connecting the drain and source metallizations of FIG. 2 with an external circuit (e.g., terminals 18 and 20 of FIG. 1) are not shown in FIG. 2.

As is also shown in FIG. 2, photodiodes 14 and 16 of the currently preferred integrated embodiments of the invention are realized with an interdigitated metal-semiconductor-metal photodiode structure. In this regard, the field-effect transistor Schottky gate metallization 28 extends beyond the boundary of drain metallization 24 and source metallization 26. Located along one edge of the extended Schottky gate metallization and projecting orthogonally away therefrom is a set of spaced-apart, finger-like strips of metallization 30 that are integrally formed with the Schottky gate metallization 28. The set of finger-like metallization strips 30 in effect defines the anode of photodiode 14 in FIG. 1. A second set of spaced-apart finger-like metallization strips 32, which defines the anode of photodiode 16 of FIG. 1, extends orthogonally from the second edge of Schottky gate metallization 28. In the depicted arrangement, each finger-like metallization strip 32 is directly opposite (i.e., colinear with) a metallization strip 30.

Interdigitated with the first set of spaced-apart metallization strips 30 is a set of spaced-apart finger-like conductive regions 34. The conductive finger-like regions 34, which define the cathode of photodiode 14 in FIG. 1, are electrically interconnected with a metallization strip 36, which extends orthogonally from drain metallization 24. The cathode of photodiode 16 of FIG. 1 is formed in a similar manner, consisting of a set of spaced-apart finger-like conductive regions 38 that are electrically connected to source metallization 26 by means of a metallization strip 40 that extends orthogonally from source metallization 26. In the currently preferred embodiments, the finger-like metallization regions 34 and 38 that define the cathodes of diodes 14 and 16 are formed by ion implantation that establishes n+doped regions that extend downwardly into substrate 22.

The use of ion-implanted conductive regions (34 and 38) instead of ohmic metal contacts is advantageous in that there is less shadowing of the substantially rectangular optically sensitive region of the substrate that is occupied by the diode structure. In this regard, and as indicated in FIG. 3, the substantially rectangular diode region of the depicted integrated circuit is dimensioned for illumination by light from a remote light source conveyed to the photodiode region by an optical fiber 42. When ion implanted conductive regions are employed, light exiting the end of optical fiber 42 impinges both on the finger-like ion-implanted conductive regions and the regions of the substrate that separate the ion-implanted conductive regions (cathode structure) from the Schottky metal finger-like regions (anode structure) of the two photodiodes. Thus, the number of carriers that are generated as the light is absorbed in the semiconductor material is significantly greater than the number of carriers generated in an arrangement in which metallization is used to define the diode cathode structure.

It will be recognized by those skilled in the art that the on-state resistance of switch 10 is determined by the drain-source conductance of field-effect transistor 12. Thus, the on-state resistance can be controlled by selectively establishing the ratio of gate length to gate width of the field-effect transistor. However, increasing the gate width relative to gate length to achieve low on-state resistance results in an increase in the off-state drain-to-source capacitance exhibited by field-effect transistor 12. Increasing the drain-to-source capacitance can limit the maximum frequency operation for switch 10 since the off-state capacitance of the switch is determined by the drain-to-source capacitance of field-effect transistor 12 and the non-illuminated capacitance of photodiodes 14 and 16.

In some situations, the on-state resistance and off-state capacitance characteristics of switch 10 present design constraints and require a trade off between switch insertion loss, isolation and maximum frequency of operation. For example, a total off-state capacitance of less than 16 femto-farads ($16 \times 10^{-15}$ farads) must be achieved in order to maintain an off-state impedance of 1,000 ohms at 10 gigahertz. Experimental devices constructed in accordance with FIGS. 1–3 exhibit an off-state capacitance approaching this value and, in addition, provide a high switch sensitivity and a relatively low on-state resistance. In this regard, experimental devices have been constructed in which the field effect transistor gate length and the width of the finger-like Schottky metallization that defines the anode structure of diodes 14 and 16 is one micrometer. In these experimental devices, the n+ion implanted finger-like regions are two micrometers wide and the rectangular pattern formed by the photodiode structure is $28 \times 26$ micrometers to accommodate the spot of light emerging from a typical optical fiber. Various experimental devices have been fabricated with gate widths ranging from 25 to 125 micrometers. As an example, the device with a gate width of 125 micrometers exhibited an on-state resistance of approximately 50Ω and an off-state capacitance of 25 femto-farads. When this device is switched from the on-state to the off-state, 1/e fall-times of 7 nanoseconds are exhibited. In situations in which more rapid off-state switching is required, a suitable RC time constant usually can be obtained by inclusion of a resistor between the gate and drain electrodes of field-effect transistor 12 (in parallel with photodiode 14) and a resistor between the gate and source electrodes of field-effect transistor 12 (in parallel with photodiode 16).

The signal handling capability of the above-described embodiments of the invention is limited to peak signal voltages that do not exceed twice the gate threshold voltage of field-effect transistor 12. That is, as can be seen in FIG. 1, when photodiodes 14 and 16 are not illuminated, the diodes in effect form a high impedance voltage divider that causes the gate electrode of field-effect transistor 12 to float at a potential that is equal to one-half the voltage appearing between switch terminals 18 and 20 (i.e., one-half the instantaneous signal value of an applied microwave signal). Thus, for example, in the above-mentioned currently preferred embodiments that utilize a GaAs MESFET, an applied microwave signal having a 0.2–0.3 peak amplitude will cause field-effect transistor 12 (and hence switch 10) to conduct during at least a portion of each cycle of the microwave signal.

Various techniques can be used to increase the signal handling capability of microwave switches that are configured in accordance with the invention. One method is to utilize a semiconductor fabrication system and/or a type of field-effect transistor that results in gate threshold values that are higher than the gate threshold values of the currently preferred embodiments. For example, using indium phosphide or another suitable group III-group V semiconductor system in place of gallium arsenide may provide the desired gate threshold voltage and, hence, the needed switch signal handling capability. In such arrangements, it may be necessary to use two or more like-poled photodiodes in place of photodiodes 14 and 16 in FIG. 1.

Another technique to increase signal handling capability is to utilize a depletion-mode field-effect transistor. If the field-effect transistor is of the depletion-mode type, an applied light signal will turn the switch off. In some situations a switch that includes a depletion-mode field-effect transistor can provide signal transmission when the photodiodes are illuminated and signal isolation when the photodiodes are not illuminated. For example, if a switch that employs a depletion-mode field-effect transistor is connected between the conductors of a microstrip transmission line, the low off-state impedance presented by the depletion mode field-effect transistor will reflect incident microwave energy when the diodes are not illuminated. When the photodiodes are illuminated, the high drain-to-source impedance exhibited by the depletion-mode field-effect transistor will allow propagation of the microwave energy along the microwave transmission line with little or no reflection.

In addition, the above-described embodiment that is schematically depicted in FIG. 1 can be configured for increased signal handling capabilities. In particular, when a plurality of N switches 10 are connected in cascade, the signal handling capability of the cascaded switches stages increases by a factor of N. An embodiment including four cascaded microwave switches 10 is shown in FIG. 4, with the four cascaded stages connected between a terminal 44 and a terminal 46.

Figure 4:
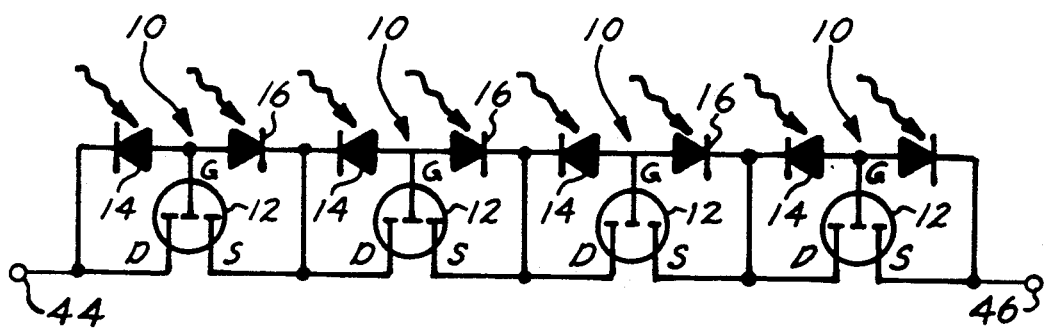
FIG. 4 schematically depicts a second embodiment of the invention in which a plurality of switches of the type shown in FIG. 1 are connected in cascade to increase switch signal handling capability.

Viewing FIG. 4, it can be recognized that the on-state resistance of a cascaded arrangement of switches 10 is N times the on-state resistance of each of the N field-effect transistors. Thus, the signal handling capabilities of the embodiment of FIG. 1 can be increased by a factor equal to N without increasing the on-state resistance by decreasing the gate length-to-width ratio by a factor of N. Since the gate length of the currently preferred embodiments of the invention is relatively narrow (one micrometer), the usual practice is to increase the gate width.

As also can be seen in FIG. 4, photodiodes 14 and 16 in effect form a series-connected string between switch terminals 44 and 46. Thus, the total capacitance exhibited by the photodiodes of N-cascaded switch stages 10 is equal to the capacitance of one pair of photodiodes 14 and 16 divided by N. Thus, it is possible for each photodiode of an embodiment of the invention that employs N-cascaded switch stages to exhibit a photosensitive area substantially identical to a single stage switch (e.g., the switch of FIGS. 1-3), without deleteriously affecting the maximum frequency at which the switch can operate.

Figure 5:
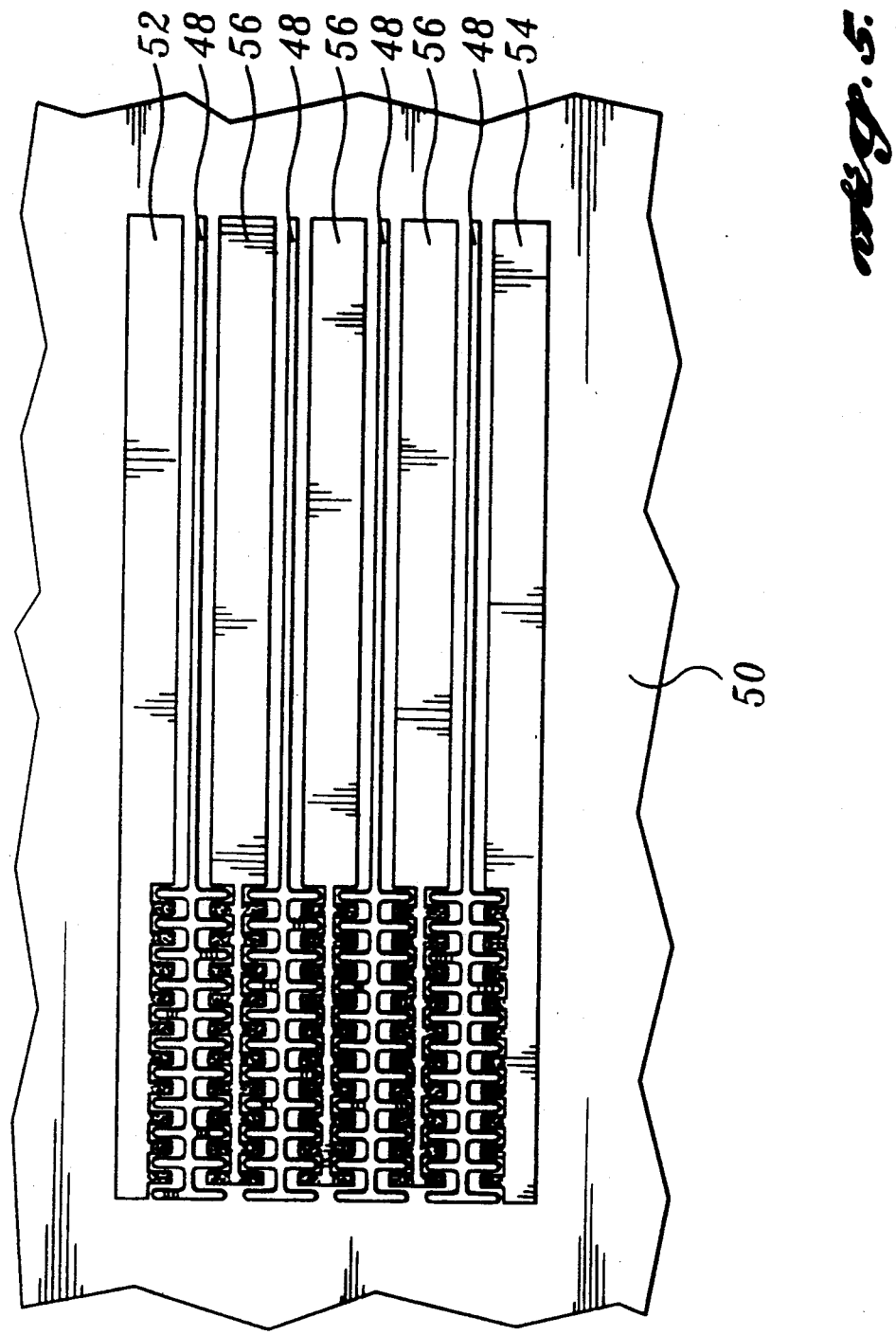
FIG. 5 is a plan view of an integrated circuit realization of the cascaded switch arrangement of FIG. 4.

Embodiments of the invention that employ cascaded switch stages are readily and efficiently realized in integrated circuit form. In this regard, FIG. 5 illustrates an integrated circuit realization of the four-stage switch circuit shown in FIG. 4. In the integrated circuit realization of FIG. 5, the gate region of each field-effect transistor is defined by a relatively narrow metallization region 48 that extends along the surface of a substrate 50 and establishes a Schottky barrier at the interface between the semiconductor substrate and the metallization. As is the case with the embodiment of FIGS. 2 and 3, each gate metallization 48 is positioned between a pair of substantially rectangular metallization regions that extend in spaced-apart juxtaposition with one another. However, in viewing FIG. 5, it can be recognized that separate metallization regions are not employed to define each drain and source region of the four field-effect transistors that are included in the embodiment of FIG. 5. In particular, the uppermost and lowermost metallizations 52 and 54 of FIG. 5 define the drain and source regions of the field-effect transistors 12 that are directly connected to terminals 44 and 46 of FIG. 4. The three metallization regions 56 that are in spaced-apart juxtaposition with one another and are positioned between metallization strips 52 and 54 each define the source region of one of the field-effect transistors 12 and the drain region of the field-effect transistor 12 for the next stage of the cascaded arrangement.

With continued reference to FIG. 5, it can be noted that the 2N photodiodes of an embodiment employing N-cascaded switch stages are realized in a manner similar to realization of the photodiodes in the integrated circuit arrangement of FIG. 2. In particular, in the cascaded arrangement of FIG. 5, each Schottky gate metallization extends beyond the boundary of the circuit region that defines the field-effect transistors. The region of the gate metallization that extends beyond the field-effect transistor boundary includes a first and second set of integral spaced-apart finger-like strips that extend orthogonally from the two edges of the Schottky gate metallization 48. As was the case in the single stage switch embodiment, the two sets of integrally formed finger-like metallization regions define the anodes of a pair of photodiodes 14 and 16. The cathode regions of the photodiodes employed in the embodiment of FIG. 5 are defined in a manner similar to the arrangement of FIGS. 2 and 3. That is, the cathode regions of the diodes are formed by sets of spaced-apart finger-like conductive regions that are interdigitated with the finger-like Schottky metallization regions that define the anode structure of the diodes. However, in the arrangement of FIG. 5, the conductive regions that define the cathode structure of the photodiodes consist of metallization that is integral with and extends from the metallization that define the field-effect transistor drain and source regions (i.e., metallization regions 52, 54, and 56 in FIG. 5).

As previously mentioned, to maintain the on-state resistance of N-cascaded switch stages equal to the on-state resistance of a particular realization of the embodiment shown in FIG. 1, the field-effect gate width-to-length ratio in the N-cascaded arrangement should be N times greater than the gate width-to-length ratio in the single stage embodiment. As also was previously mentioned, the photodiodes of a N-cascaded switch stage embodiment collectively exhibit a non-illuminated capacitance that is approximately equal to 1/N times the non-illuminated capacitance of a single stage embodiment that uses identical photodiode structure. Thus, in the four-cascaded switch stage integrated circuit arrangement of FIG. 5, the area of each pair of photodiodes can be increased to provide an optically sensitive region that reasonably matches the illumination pattern that is employed to simultaneously activate each stage of the circuit arrangement. For example, in a four-stage embodiment of the type shown in FIG. 5, each of the eight photodiodes can occupy a 100 micrometer × 12.5 micrometer rectangular substrate region (total photosensitive region 100 micrometers × 100 micrometers) to maintain the maximum signal frequency at which the switch can operate equal to that of the previously described single stage integrated circuit embodiment of FIGS. 2 and 3 (photosensitive region 26 × 28 micrometers).

It should be noted that the invention has been described with reference to specific embodiments. Those skilled in the art will recognize that various changes and modifications can be made in the disclosed embodiments without departing from the scope and the spirit of the invention. For example, as previously noted, optical energy can be provided to the photodiodes of the invention from a remote light source by transmission light means other than an optical fiber. Such means include, but are not limited to, optical waveguides. Externally focused beams also could be used. In addition, and as previously mentioned, various semiconductor device structures and semiconductor material systems can be utilized.

The embodiments of the invention in which an property or privilege is claimed are defined as follows:

1. An optoelectronic microwave switching system comprising:
   means for supplying a microwave signal;
   transmission means for conveying said microwave signal;
   switch means for receiving said microwave signal and for operating in an on state to pass said signal therethrough and in an off state to block passage of said signal therethrough, said switch means including a field-effect transistor having a gate electrode, a source electrode and a drain electrode one of said source and drain electrodes being connected to said transmission means, and at least two photodiodes, each having an anode and a cathode, the anodes of two of said photodiodes being coupled to said gate electrode of said field-effect transistor, the cathodes of said two photodiodes being respectively coupled to the source and drain electrodes of said field-effect transistor, said two photodiodes being responsive to optical energy to control the state of operation of said switch means;
   a light source remote from said switch means for selectively supplying optical energy; and
   light transmission means for conveying optical energy from said remote light source to said photodiodes so as to activate said photodiodes to control the state of operation of said switch means.

2. The system of claim 1, wherein two photodiodes are employed in said switch with the cathode of the first one of said two photodiodes being directly connected to the source electrode of said field-effect transistor and the cathode of the second one of said two photodiodes being directly connected to said drain electrode of said field-effect transistor.

3. The system of claim 2, wherein said two photodiodes are Schottky barrier diodes.

4. The system of claim 1, wherein said photodiodes and said field-effect transistor are monolithically integrated in a common substrate.

5. The system of claim 4, wherein two photodiodes are included in said switch means with the cathode of one of said two photodiodes being directly connected to the source electrode of said field-effect transistor and with the cathode of the second photodiode being directly connected to said drain electrode of said field-effect transistor.

6. The system of claim 5, wherein said common substrate is gallium arsenide.

7. The system of claim 5, wherein said field-effect transistor is an enhancement-mode metal semiconductor field-effect transistor.

8. The system of claim 5, wherein said transistor is a heterostructural-based transistor.

9. The system of claim 2, wherein said switch means includes a first resistor connected between said gate and said source electrodes of said field-effect transistor and includes a second resistor connected between said gate and drain electrodes of said field-effect transistor.

10. The system of claim 4, wherein said anodes of said two photodiodes are realized as first and second sets of commonly connected spaced-apart finger-like metallization regions that extend along the surface of the substrate and form a Schottky barrier with said substrate.

11. The system of claim 10, wherein said cathode of one of said photodiodes is formed by a set of commonly connected spaced-apart finger-like conductive regions that are interdigitated with said first set of said finger-like metallization regions that form said Schottky barrier and wherein said cathode of the of said photodiodes is formed by a set of finger-like spaced-apart conductive regions that are interdigitated with said second set of finger-like metallization regions that form said Schottky barrier.

12. The system of claim 11, wherein said field-effect transistor is an enhancement mode metal-semiconductor field-effect transistor and said substrate is gallium arsenide.

13. An optically activated microwave switching apparatus comprising:
   a plurality of cascade connected optoelectronic switch stages, each switch stage including a field-effect transistor and two photodiodes, the anodes of each of said two photodiodes being connected to the gate of said field-effect transistor and the cathodes of said two photodiodes being respectively connected to the drain and source of said field-effect transistor.

14. The optically activated microwave switching apparatus of claim 13 wherein said plurality of cascade connected optoelectronic switch stages is monolithically integrated using a gallium arsenide substrate; said field-effect transistor of each said cascade connected optoelectronic switch stage is a metal-semiconductor field-effect transistor and each said photodiode is a metal-semiconductor-metal structure in which the photodiode is formed by sets of interdigitated conductive finger-like regions.

15. The optically activated microwave switching apparatus of claim 13 wherein each of said cascade connected optoelectronic switch stages includes a pair of resistors, one of said resistors being connected between the gate and source of the field-effect transistor of the optoelectronic switch stage and the other one of said pair of resistors being connected between the gate and drain of the field-effect transistor of the optoelectronic switch stage.

16. The system defined in claim 1, in which the switch means includes:
   a semi-insulating substrate formed of a Group III-V semiconductor, said substrate having at least one substantially planar surface the field-effect transistor being a metal-semiconductor field-effect transistor including spaced apart source and drain metallizations formed on said substantially planar surface of said substrate and a gate metallization that extends along said substantially planar surface of said substrate in spaced-apart juxtaposition with said source and drain metallizations, said metal-semiconductor field-effect transistor exhibiting a first drain-to-source conduction state when the difference in electrical potential between said gate metallization and both said drain and source metallizations is less than a predetermined amount and exhibiting a second drain-to-source conduction state when the electrical potential at said gate metallization differs from the electrical potential at said source and drain metallizations by at least said predetermined amount, the photodiodes including at least two metal-semiconductor-metal photodiodes formed on said planar surface of said substrate, said photodiodes being electrically interconnected with said gate electrode, said drain electrode and said source electrode of said metal-semiconductor field-effect transistor for controlling the potential at said gate metallization to maintain said field-effect transistor in said first drain-to-source conduction state when said photodiodes are illuminated and to maintain said metal-semiconductor field-effect transistor in said second drain-to-source conduction state when said metal-semiconductor-metal diodes are not illuminated.

17. The system of claim 16 wherein said Group III-V semiconductor compound is gallium arsenide.

18. The system of claim 17 wherein said metal-semiconductor field-effect transistor is an enhancement mode device, said gate metallization of said metal-semiconductor field-effect transistor is electrically connected to the anode electrodes of first and second metal-semiconductor-metal photodiodes, the cathode of said first metal-semiconductor-metal photodiode is connected to said drain metallization of said metal-semiconductor field-effect transistor, and the cathode of said second metal-semiconductor-metal photodiode is connected to said source metallization of said metal-semiconductor field-effect transistor, said first and second metal-semiconductor-metal photodiodes maintaining said gate metallization at a potential that allows bidirectional current flow between said source and drain electrodes when said metal-semiconductor-metal photodiodes are illuminated.

19. The system of claim 18 wherein said source and drain metallizations are substantially rectangular in geometry and are of substantially equal area; and wherein said gate metallization forms a Schottky barrier with said semi-insulating substrate.

20. The system of claim 19 wherein said gate metallization is of relatively narrow strip-like geometry and extends beyond said drain and source metallization, said anodes of said metal-semiconductor-metal photodiodes being defined by substantially parallel spaced-apart extensions of said gate metallization that extend along substantially planar surface of said substrate and are substantially orthogonal to said gate metallization; said cathodes of said first and second metal-semiconductor-metal photodiodes being defined by substantially parallel spaced-apart finger-like conductive regions that are interspersed with said substantially parallel spaced-apart finger-like extensions of said gate metallization.

21. The system of claim 20 wherein said substantially parallel spaced-apart conductive regions that define said cathodes of said metal-semiconductor-metal photodiodes are ion implanted n+ regions that extend inwardly into said semi-insulating semiconductor substrate from said substantially planar surface.

22. The system of claim 21 wherein said substantially parallel spaced-apart finger-like regions that define said anodes of said first and second metal-semiconductor-metal photodiodes and said substantially parallel spaced-apart conductive regions that define said cathodes of said metal-semiconductor-metal photodiodes are positioned within a substantially rectangular region of said substantially planar surface of said semi-insulating substrate.

23. The system of claim 22 wherein said metal-semiconductor-metal photodiodes are illuminated by an optical fiber and wherein said substantially rectangular region of said substantially planar semi-insulating substrate is commensurate in area with the optical spot size of said optical fiber.

24. An integrated circuit microwave frequency switch comprising:

a semi-insulating substrate formed of a Group III-V semiconductor, said substrate having at least one substantially planar surface;

a metal-semiconductor field-effect transistor including spaced apart source and drain metallizations formed on said substantially planar surface of said substrate and a gate metallization that extends along said substantially planar surface of said substrate in spaced-apart juxtaposition with said source and drain metallizations, said metal-semiconductor field-effect transistor exhibiting a first drain-to-source conduction state when the difference in electrical potential between said gate metallization and both said drain and source metallizations is less than a predetermined amount and exhibiting a second drain-to-source conduction state when the electrical potential at said gate metallization differs from the electrical potential at said source and drain metallizations by at least said predetermined amount;

at least two metal-semiconductor-metal photodiodes formed on said planar surface of said substrate, said photodiodes being electrically interconnected with said gate electrode, said drain electrode and said source electrode of said metal-semiconductor field-effect transistor for controlling the potential at said gate metallization to maintain said field-effect transistor in said first drain-to-source conduction state when said photodiodes are illuminated and to maintain said metal-semiconductor field-effect transistor in said second drain-to-source conduction state when said metal-semiconductor-metal diodes are not illuminated;

said gate metallization of said metal semiconductor field-effect transistor being electrically connected to the anode electrodes of said two metal-semiconductor-metal photodiodes, the cathode of one of said metal-semiconductor-metal photodiodes being connected to said drain metallization of said metal-semiconductor field-effect transistor, and the cathode of the other metal-semiconductor-metal photodiode being connected to said source metallization of said metal-semiconductor field-effect transistor, said metal-semiconductor-metal photodiodes maintaining said gate metallization at a potential that allows bidirectional current flow between said source and drain electrodes when said metal-semiconductor-metal photodiodes are illuminated said gate metallization being of relatively narrow strip-like geometry and extending beyond said drain and source metallization, said anodes of said metal-semiconductor-metal photodiodes being defined by substantially parallel spaced-apart extensions of said gate metallization that extend along said substantially planar surface of said substrate and being substantially orthogonal to said gate metallization, said cathodes of said first and second metal-semiconductor-metal photodiodes being defined by substantially parallel spaced-apart finger-like conductive regions that are interspersed with said substantially parallel spaced-apart finger-like extensions of said gate metallization.

25. The integrated circuit microwave frequency switch of claim 24 wherein said substantially parallel spaced-apart finger-like regions that define said anodes of said first and second metal-semiconductor-metal photodiodes and said substantially parallel spaced-apart conductive regions that define said cathodes of said metal-semiconductor-metal photodiodes are positioned within a substantially rectangular region of said substantially planar surface of said semi-insulating substrate.

26. The integrated circuit microwave frequency switch of claim 25 wherein said metal-semiconductor-metal photodiodes are illuminated by an optical fiber and wherein said substantially rectangular region of said substantially planar semi-insulating substrate is commensurate in area with the optical spot size of said optical fiber.

27. The integrated circuit microwave frequency switch of claim 26 wherein said source and drain metallizations are substantially rectangular in geometry and are of substantially equal area; and wherein said gate metallization forms a Schottky barrier with said semi-insulating substrate.

28. The integrated circuit microwave frequency switch of claim 27 wherein said substantially parallel spaced-apart conductive regions that define said cathodes of said metal-semiconductor-metal photodiodes are ion implanted n+ regions that extend inwardly into said semi-insulating semiconductor substrate from said substantially planar surface.

29. An optoelectronic integrated microwave switch comprising:
a substantially planar Group III-V semiconductor substrate;
a plurality of n metal-semiconductor field-effect transistors, said plurality of n metal-semiconductor transistors being defined by a plurality of (n+1) substantially rectangular metallization regions and by a plurality of n strip-like metallization regions, said (n+1) metallization regions being formed on one surface of said substantially planar semiconductor substrate with boundary edges of said (n+1) metallization regions being substantially parallel to one another, said n strip-like metallization regions extending along said surface of said semiconductor substrate with each said strip-like metallization region being positioned between and substantially parallel to boundary edges of said different pair of said (n+1) metallization regions; each said strip-like metallization region defining a gate electrode of a different one of n metal-semiconductor field-effect transistors with said pair of said (n+1) metallization regions that is associated with said strip-like metallization region defining the drain and source electrodes of that particular one of said n metal-semiconductor field-effect transistors; and n-pairs of Schottky barrier photodiodes formed on said surface of said semiconductor substrate, each pair of said Schottky barrier photodiodes being associated with and electrically connected to a different one of said strip-like metallization regions that defines a gate electrode of one of said n metal-semiconductor field-effect transistors and being associated with and electrically connected to the pair of metallization regions that define said source and drain electrodes of that particular one of said n metal-semiconductor field-effect transistors, said n-pairs of Schottky barrier photodiodes maintaining said n metal-semiconductor field-effect transistors in a first state of electrical conductivity when said n pairs of photodiodes are illuminated and a second state of electrical conductivity when said n pair of photodiodes are not illuminated.

30. The optoelectronic integrated microwave switch of claim 29 wherein each of said n-pairs of Schottky barrier diodes is a pair of metal-semiconductor-metal diodes in which the anode and cathode of each diode is defined by a first and second series of interdigitated spacedapart finger-like conductive regions.

31. The optoelectronic integrated microwave switch of claim 30 in which said n-pairs of metal-semiconductor-metal photodiodes are positioned on said surface of said semiconductor substrate to define a photosensitive region sized to substantially correspond with the optical spot size of an optical fiber.

32. The optoelectronic integrated microwave switch of claim 31 wherein each said strip-like metallization region that defines a gate electrode of one of said n metal-semiconductor field-effect transistors extends outwardly from between said boundary edges of the spaced-apart pair of said of (n+1) metallization regions associated with that particular strip-like metallization region to form said series of spaced-apart finger-like conductive regions that define anodes of the pair of metal-semiconductor-metal photodiodes that is associated with and electrically connected to said strip-like metallization region.

33. The optoelectronic microwave integrated switch of claim 32 wherein at least one of said first and second series of said interdigitated spaced-apart finger-like conductive regions that define the anodes and cathodes of said n-pairs of metal-semiconductor-metal photodiodes is formed by ion implantation.

34. The optoelectronic integrated microwave switch of claim 33 wherein said Group III-IV semiconductor substrate is gallium arsenide.

* * * * *